US 6,643,819 B1

(12) United States Patent
Weng

(10) Patent No.: US 6,643,819 B1
(45) Date of Patent: Nov. 4, 2003

(54) HYBRID ROOT-FINDING TECHNIQUE

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/491,523

(22) Filed: Jan. 26, 2000

(51) Int. Cl.[7] .............................................. H03M 13/00
(52) U.S. Cl. ...................................... 714/785; 714/784
(58) Field of Search ............................... 714/781, 784, 714/785

(56) References Cited

U.S. PATENT DOCUMENTS

| 4,099,160 A | * | 7/1978 | Flagg | 714/785 |
| 4,162,480 A | * | 7/1979 | Berlekamp | 714/784 |
| 5,107,503 A | * | 4/1992 | Riggle et al. | 714/784 |
| 5,268,908 A | * | 12/1993 | Glover et al. | 714/785 |
| 5,771,246 A | * | 6/1998 | Weng | 714/762 |
| 5,974,582 A | * | 10/1999 | Ly | 714/781 |
| 6,343,367 B1 | * | 1/2002 | Shen et al. | 714/782 |

OTHER PUBLICATIONS

Elwyn R. Berlekamp, "Algebraic Coding theory", McGraw–Hill, Inc., 1968.*

* cited by examiner

Primary Examiner—Christine T. Tu
Assistant Examiner—Joseph D. Torres
(74) Attorney, Agent, or Firm—Daly, Crowley & Mofford, LLP

(57) ABSTRACT

A root finding mechanism uses an affine polynomial to find the roots of an error locator polynomial. The affine polynomial is produced from the error locator polynomial and field elements for generating roots of the affine polynomial are determined. Gray code is used to select the field elements used to generate the different roots of the affine polynomial. The roots are tested as possible true roots of the error locator polynomial.

16 Claims, 6 Drawing Sheets

HYBRID ROOT-FINDING TECHNIQUE

BACKGROUND OF THE INVENTION

The invention relates generally to error correction code decoding mechanisms and, more particularly, to the decoding of Reed-Solomon error correction codes.

The use of increasingly higher density storage media in digital computer systems has caused an increase in the potential for defect-related data errors. To reduce data loss as a result of such data corruption, error correction codes are employed to correct the erroneous data.

Prior to storing data on a storage device, such as a magnetic disk or tape, it is encoded to form redundancy symbols. The redundancy symbols are appended to the data symbols to form code words, which are then stored on the storage device. When the stored data is retrieved from the storage device for decoding, the redundancy symbols provide information that allows the decoder to recognize errors and, if possible, reconstruct the original code word. For a detailed description of decoding, see "Error-Correcting Codes," Second Edition, by W. Wesley Peterson and E. J. Weldon, Jr. (MIT Press, 1972). One widely-used error correction code is the Reed-Solomon code.

To correct errors, a Reed-Solomon decoder must determine the locations and values (or magnitudes) of the detected errors. The decoder first computes error syndromes, which it then uses to generate an error locator polynomial. Once the error locator polynomial has been generated, each error location and value may be determined.

Error locations are determined by solving for the roots of the error locator polynomial $\sigma(x)$ of degree t or less, where t is the number of errors that can be corrected. The solution or roots of the equation $\sigma(x)=0$ correspond to the locations of the errors. These roots are of the form $x=\alpha^i$, where $\alpha$ is the primitive element of the Galois Field $GF(p^q)$ used to encode the data. Once all of the roots have been found, the corresponding error values are calculated using the well-known Forney algorithm. The data can then be corrected to produce an error-free data symbol.

Typically, the root-finding is the most time-consuming procedure in the decoding process. Presently, it is possible to solve for roots of low degree error locator polynomials in an efficient, direct manner. One such approach, which solves for four or less errors directly, is described in U.S. Pat. No. 5,710,782, in the name of Lih-Jyh Weng, incorporated herein by reference. The least complicated approach for solving for error locator polynomials of degree 5 to degree m−1 (where m is the symbol size) remains the Chien search, which examines each possible error location to determine if the error location is indeed an actual error location (or root) of the error locator polynomial. The decoding speed of the Chien search may be optimized by increasing the number of root-finding circuits that are used.

SUMMARY OF THE INVENTION

In one aspect of the invention, processing an erroneous code word includes finding field elements for generating roots of a least multiple of an error locator polynomial associated with the erroneous code word, using a binary code to select a linear combination of one or more of the field elements for each of the roots to be generated and generating each of the roots from each selected linear combination.

Embodiments of the invention may include one or more of the following features.

Locations of errors in the erroneous code word are determined from the generated roots. Determining the error locations from the generated roots includes determining which of the generated roots are true roots of the error locator polynomial, the true roots of the error locator polynomial corresponding to the locations of errors.

The binary code is a Gray code.

The root generation includes performing an Exclusive-OR operation on the selected linear combination. Using a binary code includes choosing one of the field elements to be Exclusive-ORed with a previously generated root for each root generation.

In another aspect of the invention, processing an erroneous code word includes generating an error locator polynomial from the erroneous code word and using a binary code to generate possible root values of the error locator polynomial.

Embodiments of the invention may include one or more of the following features.

The possible root values are evaluated as true roots of the error locator polynomial, the true roots of the error locator polynomial corresponding to locations of errors. The binary code is a Gray code.

Among the advantages of the hybrid root finding mechanism of the present invention are the following. Typically, the set of roots of the least multiple of the error locator polynomial (or "affine polynomial") is a small subset of all possible error locations. Therefore, the search speed can be increased significantly by examining only the roots of the affine polynomial. Additionally, the property of Gray code allows a root of the affine polynomial to be constructed by using only one logic XOR operation, which adds to a previously constructed root.

Other features and advantages of the invention will be apparent from the following detailed description and from the claims.

DESCRIPTION OF THE PREFERRED EMBODIMENTS

The present invention features an error locator polynomial root finding mechanism that is hybrid in nature. The hybrid root finding mechanism finds roots of a least multiple of the error locator polynomial (referred to as an affine polynomial) and constructs those roots using a Gray code. Once constructed, the roots are examined to determine if they are true roots of the error locator polynomial.

Figure 1:
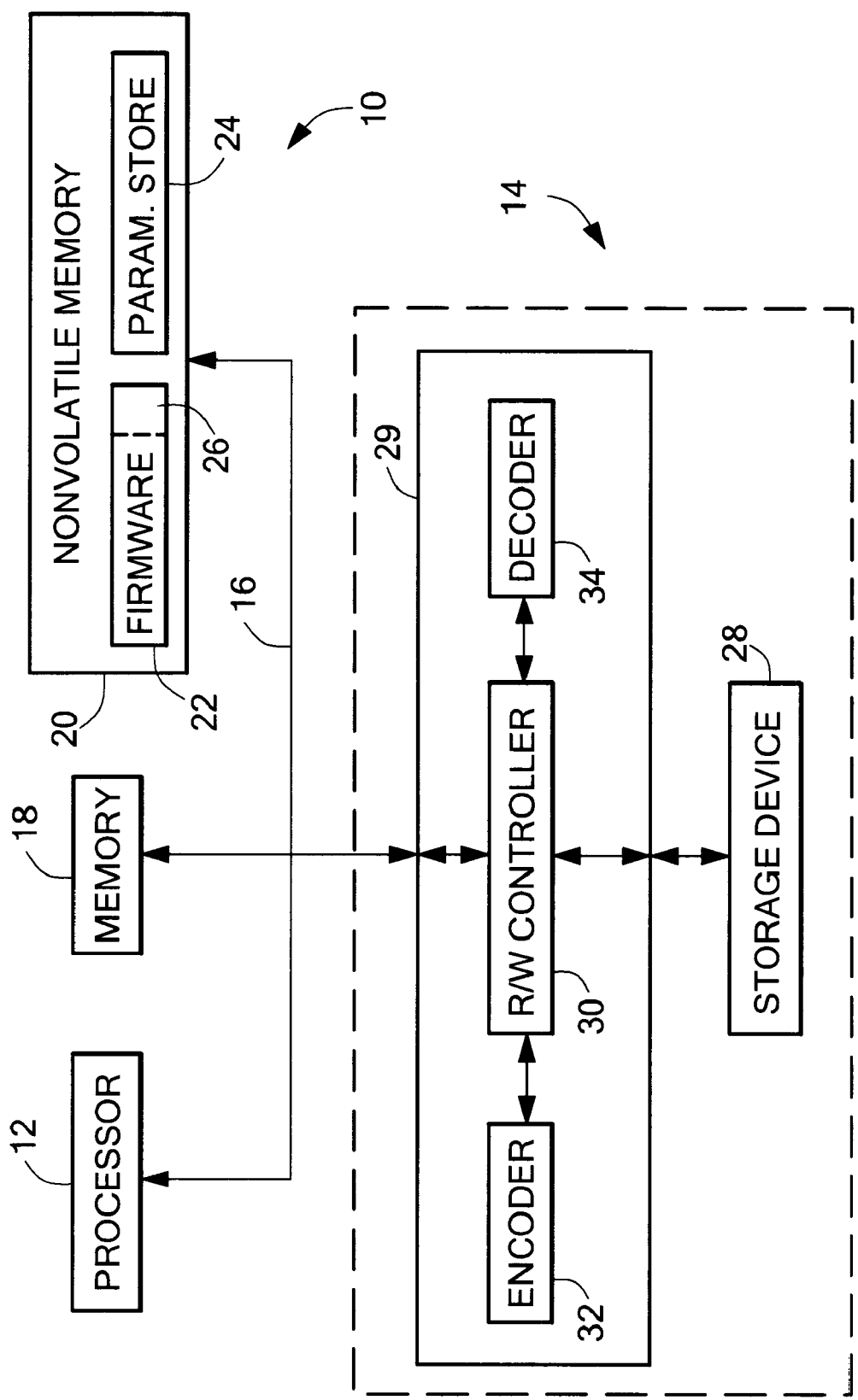
FIG. 1 is a block diagram of an exemplary data storage system that includes a decoder employing a hybrid root determiner for determining error locations.

Referring to FIG. 1, an exemplary data storage system 10 is shown. The data storage system 10 includes a processor 12 coupled to a mass storage system 14 by way of a peripheral bus 16, e.g., a SCSI bus. Also connected to the bus 16 are a memory 18 and a nonvolatile memory 20. The processor 12 controls the overall operations of the data storage system 10 and communicates with the memory 18 and the mass storage system 14 over the bus 16. The nonvolatile memory 20 stores system firmware 22 and parameter data in a parameter store 24, and is read each time the data storage systems 10 boots. Stored in the memory 18 are data structures created and maintained by the firmware processes as executed by the processor 12. The memory 18 also stores data read from the mass storage system 14.

The mass storage system 14 includes a storage controller 29, which is coupled to a storage device 28. The storage device 28 includes a storage medium such a magnetic disk. Included in the controller 29 are a read/write controller 30, along with an encoder 32 and a decoder 34. The read/write (R/W) controller 30 supervises the recording of data on and retrieval of data from the storage device 28. It also directs the encoder 32 to encode data written to the storage device 28 and directs the decoder 34 to decode the coded data as it is read back from the storage device 28. In the described embodiment, the encoder and decoder (32 and 34, respectively), are of the Reed-Solomon type and are configured to perform conventional Reed-Solomon encoding algorithms. In addition to performing conventional Reed-Solomon decoding algorithms, the decoder 34 is suitably modified to find error locations using affine polynomial roots generated by Gray coding, as will be described.

Figure 2:
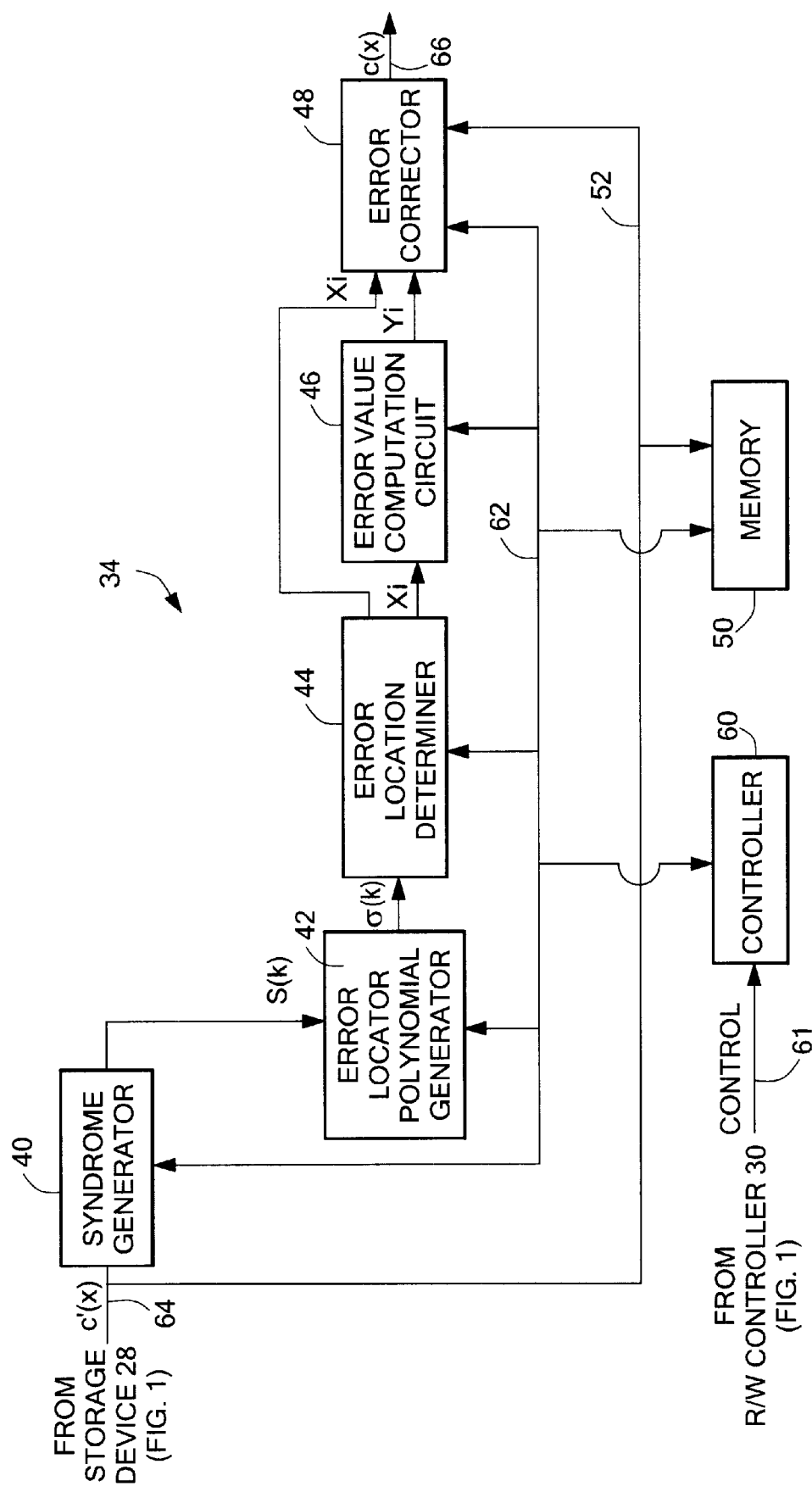
FIG. 2 is a block diagram of the decoder of FIG. 1.

Referring to FIG. 2, the decoder 34 includes an arrangement of functional units, including a syndrome generator 40, an error locator polynomial generator 42, an error location determiner 44, an error value computation unit 46 and an error corrector 48. Also included is a memory 50 for storing a copy of a received code word received on a data bus 52. The memory 50 stores the received code word while the locations and values of detected errors of the received codeword are being computed by units 40, 42, 44 and 46, collectively. The units 42, 44, 46 and 48 are conventional decoder blocks, the details of which are largely omitted herein. Control of each of these functional units 40, 42, 44, 46 and 48 is effected by a controller 60, which operates in accordance with control signals 61 received from the R/W controller 30 (shown in FIG. 1). Decoding control signals are provided to the functional units 40, 42, 43, 44, 46 and 48 by the controller 60 over a control bus 62.

The decoder 34 receives as an input a codeword c(x), which may contain some error e(x), from the storage device 28 (shown in FIG. 1). The received code word, i.e., c(x)+e(x), is referred to as c'(x). It will be appreciated that c'(x) is not equal to c(x) when there is at least one bit in a symbol $c'_j$ which differs from the corresponding bit of the corresponding symbol $c_j$.

Referring back to FIG. 1, the code word c(x) is produced by the encoder 32 by encoding data to be stored on the storage device 28 in an encoding operation. The code word c(x) is made up of n symbols, including k information or data symbols d(x) and R (i.e., "n–k") redundancy symbols r(x). Each of the symbols is m bits in length. The redundancy symbols are derived by dividing the information symbols by a generator polynomial g(x). Division results in a quotient q(x), which is ignored, and a remainder r(x). The remainder includes the redundancy symbols which are then added to the n–k lowest order locations of c(x). With Reed-Solomon codes, the number of redundancy symbols R to correct an error must be at least twice the number of errors t that are to be corrected; thus, there must be R≥2t redundancy symbols in a t-error-correcting code. As the order of the remainder corresponds to the order of the divisor, the generator polynomial implemented for a t error correcting Reed-Solomon code having n≤$2^m$–1, m-bit symbols is as follows:

$$g(x)=(x-\alpha^L)(x-\alpha^{L+1}) \ldots (x-\alpha^{L+r-1}) \qquad \text{Eq. (1)}$$

where $\alpha^i$ for i=L, L+1, ... L+r–1, is a field element of GF($2^m$) and L is a constant of the Galois field factor (x–$\alpha^i$). The code word c(x) is a multiple of both the generator polynomial and each of its factors or roots. Thus, the division of the received word c'(x) by the generator polynomial g(x) or each of its roots, if the received worked contains no errors, results in some quotient and a remainder of zero. In general, with reference to Eq. 1, the value of L can be arbitrarily selected.

Referring again to FIG. 2, the corrupt codeword c'(x), which corresponds to codeword c(x) generated by g(x) for a selected value of L in accordance with Eq. 2 during encoding, is applied to the syndrome generator 40 over an input bus 64. For error correction purposes, it is necessary to generate a number of syndromes equal to twice the number of errors being corrected, i.e., 2t. The syndrome is defined as the remainder after dividing the received word c'(x) by a root (x–$\alpha^i$) of the generator polynomial g(x). This is the equivalent of evaluating the received polynomial c'(x) at $\alpha^i$, i.e., c'($\alpha^i$). As there are 2t such roots, there are 2t syndromes. The syndromes are mathematically related to error locations and error values by the relationship:

$$S(k) = \sum_{0}^{t-1} Y_i X_i^k \qquad \text{Eq. (2)}$$

where $X_i$ are the error locations and the $Y_i$ are the error values, and S(k)=c'($\alpha^k$). $X_i$ is an element of the Galois Field and the power of $\alpha$ corresponds to the location of the symbol error, i.e., if $X_i=\alpha^{83}$, the 83rd symbol is in error. The value of $Y_i$ is also an element of Galois Field GF($2^m$) and corresponds to the error pattern.

Therefore, the syndrome generator 40 tests the received code word c'(x) for the presence of errors by computing syndromes, S(k)=c'($\alpha^k$), where k=L, L+1, ..., L+R–1. If all syndromes S(k) are zero, then there is no error and therefore no need for further decoding. If at least one S(k) is nonzero, the codeword c'(x) must be subject to further processing by the decoder 34.

During a decoding process, the controller 60 directs the syndrome generator 40 to provide the computed syndromes to the error locator polynomial generator 42, which calculates the coefficients of an error locator polynomial from the computed syndromes according to known algorithms, such as the Berlekamp-Massey or Euclidean algorithms. The error locator polynomial is of the form:

$$\sigma(x)=\sigma_t x^t+\sigma_{t-1}x^{t-1}=\sigma_{t-2}x^{t-2}+\sigma_{t-3}x^{t-3}+\sigma_2 x^2+\sigma_1 x+\sigma_0 \qquad \text{Eq. (3)}$$

for a t-error correcting code.

The coefficients of the error locator polynomial $\sigma(x)$ generated by the error locator polynomial generator 42 are transferred to the error location determiner 44. The error location determiner 44 evaluates $\sigma(x)$ for different x values and determines if the result is zero or non-zero. The values of $\sigma(x)$ equal to zero correspond to error locations $X_i$, which are provided to the error values computation unit 46 and the error corrector 48, as shown.

The error values computation unit 46 receives as inputs the error locations $X_i$ and the syndromes S(k) and computes error values $Y_i$ using known techniques, such as the well-known Forney algorithm. The error corrector 48 receives the codeword c'(x) from the memory 50, along with each error location $X_i$ and error value $Y_i$ from the error location determiner 44 and the error values computation unit 46, respectively. The error correction 48 adds the error value $Y_i$ to the corresponding erroneous symbol read from the error location $X_i$ to produce on an output bus 66 an error-free symbol of codeword c(x).

A conventional circuit for determining error locations is the well-known Chien search circuit. The Chien search circuit evaluates σ(x) for each power of $\alpha^j$, j=0, 1, 2, 3, ..., n−1 (n being the total number of symbols in the codeword c'(x)). Typically, the Chien search circuit includes t+1 number of multipliers for multiplying the error locator polynomial coefficients by corresponding powers of α, and a summation unit. After each coefficient $\sigma_j$ is multiplied by the appropriate multiplier $\alpha^j$, the resulting values are summed and compared to zero. If the result of the zero compare indicates a value of zero, then that value of x is a root and therefore corresponds to an error location. The circuitry of the Chien search circuit is clocked n times to evaluate n values of x, i.e., x=$\alpha^0$, ..., $\alpha^{n-1}$, to test for all powers of α. An example of a Chien search circuit is provided in U.S. Pat. No. 6,374,383, entitled "Determining Error Locations Using Error Correction Codes", in the name of Lih-Jyh Weng, incorporated herein by reference.

Unlike the Chien search, which uses a trial and error approach to solving for the roots of the error locator polynomial σ(x), the error location determiner 44 uses a hybrid root finding technique that is affine polynomial-based. An affine polynomial is defined to be L(x)+U, where L(x) is a linearized polynomial and U is a constant or a field element of GF($2^m$). The linearized polynomial L(x) over GF($2^m$) is given by $$L(x) = \sum_j L_j x^{2^j} \qquad \text{Eq. (4)}$$

A linearized polynomial L(x) therefore contains only terms with powers x being $2^j$. A detailed discussion of linearized polynomials and affine polynomials may be found in Chapter 11 of "Algebraic Coding Theory" by Elwyn R. Berlekamp, McGraw-Hill Book Company, 1968, incorporated herein by reference. Using an affine polynomial A(x)=L(x)+U as a least multiple of a given error locator polynomial σ(x) of degree t, the roots of that error locator polynomial σ(x) may be determined.

Figure 3:
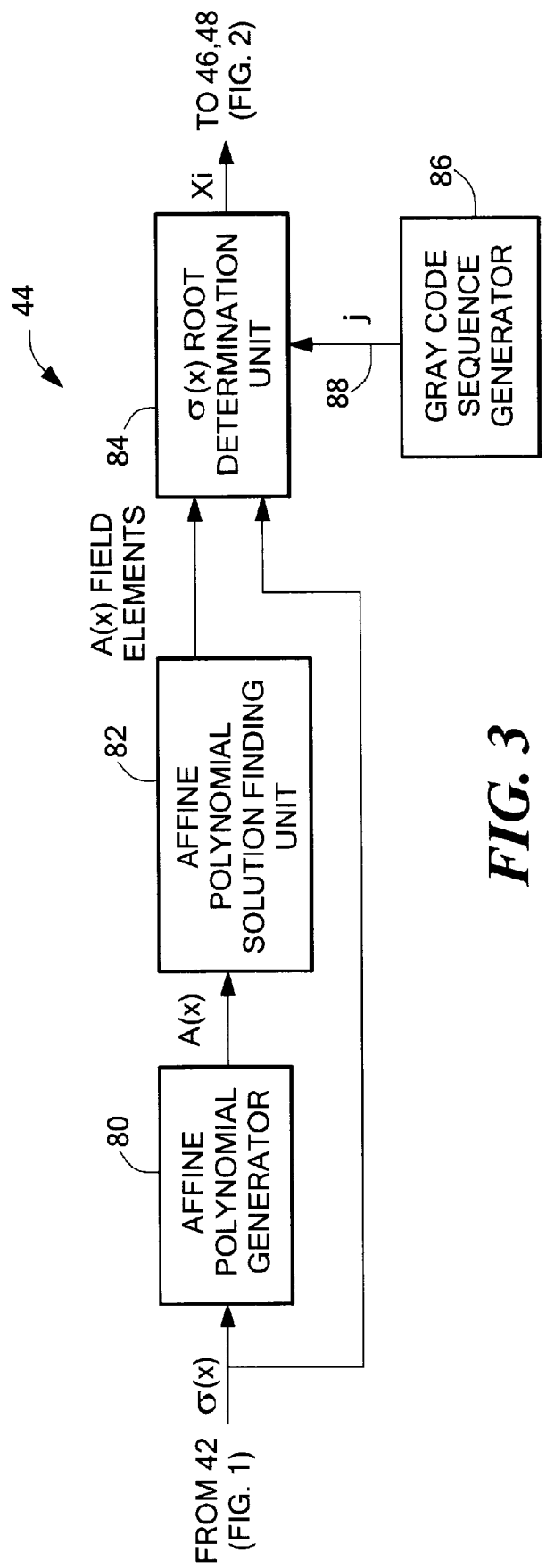
FIG. 3 is a block diagram of the hybrid root determiner of FIGS. 1 and 2.

Accordingly, and referring to FIG. 3, the error location determiner 44 includes an affine polynomial generator 80 which receives the error locator polynomial σ(x) from the error locator polynomial generator 42 (FIG. 2) and produces a least affine multiple A(x) therefrom. The error location determiner 44 further includes an affine polynomial solution finding unit 82 for producing a solution comprising field values for A(x) from the A(x) coefficients received from the affine polynomial generator 80.

Also included in the error location determiner 44 are an error locator polynomial (σ(x)) root determination unit 84 and a Gray code sequence generator 86. The σ(x) root determination unit 84 receives the solution for the affine polynomial and the coefficients of the error locator polynomial σ(x), along with a select signal ("j") 88 from the Gray code sequence generator 86. The σ(x) root determination unit 84 uses the select j to construct roots for A(x) from the field values and tests the roots as true roots of the error locator polynomial σ(x) to find error locations for errors occurring in c'(x), as will be described in further detail below with reference to FIG. 5.

The operation of the affine polynomial generator A(x) 80 to produce a least multiple of σ(x) will now be described. Following the development given in the above-referenced Berlekamp text, $x^0$, x, $x^2$, $x^4$, $X^8$, ..., $x^s$ mod σ(x) coefficient values are computed for s=$2^{(t-1)}$, where t is the degree of the error locator polynomial σ(x). This procedure uses an example that is similar to one given in Example 11.22 of Chapter 11 of the above-referenced Berlekamp text. However, the field is changed to a Galois field GF($2^6$) generated by the equation $$\alpha^6 + \alpha + 1 = 0. \qquad \text{Eq. (5)}$$

For an $\sigma_o(x) = x^6 + \alpha^{59}x^5 + \alpha^2 x^4 + \alpha^{24}x^3 + \alpha^{21}x^2 + \alpha^{40}x + \alpha^{59}$, $x^i$ mod $\sigma_o(x)$ are given by:

$1 = 0*x^5 + 0*x^4 + 0*x^3 + 0*x^2 + 0*x + 1;$ $x = 0*x^5 + 0*x^4 + 0*x^3 + 0*x^2 + 1*x + 0;$ $x^2 = 0*x^5 + 0*x^4 + 0*x^3 + 1*x^2 + 0*x + 0;$ $x^4 = 0*x^5 + 1*x^4 + 0*x^3 + 0*x^2 + 0*x + 0;$ $x^8 = (x^4)^2 = \alpha^{42}*x^5 + \alpha^{23}*x^4 + \alpha^{41}*x^3 + \alpha^3*x^2 + \alpha^{41}*x + \alpha^{49};$ $x^{16} = (x^8)^2 = \alpha^{55}*x^5 + \alpha^{29}*x^4 + \alpha^5*x^3 + \alpha^5*x^2 + \alpha^{20}*x + \alpha^{51};$ and $x^{32} = (x^8)^2 = \alpha^{36}*x^5 + \alpha^{30}*x^4 + 5*x^3 + \alpha^{13}*x^2 + \alpha^{24}*x + \alpha^{56}.$ To determine the least affine multiple A(x)=L(x)+U, the coefficients of the above set of equations are used to form the following matrix equation:

$$[U \;\; L_0 \;\; L_1 \;\; L_2 \;\; L_3 \;\; L_4 \;\; L_5] \qquad \text{Eq. (6)}$$

$$\begin{pmatrix} 0 & 0 & 0 & 0 & 0 & 1 \\ 0 & 0 & 0 & 0 & 1 & 0 \\ 0 & 0 & 0 & 1 & 0 & 0 \\ 0 & 1 & 0 & 0 & 0 & 0 \\ \alpha^{42} & \alpha^{23} & \alpha^{41} & \alpha^3 & \alpha^{41} & \alpha^{49} \\ \alpha^{55} & \alpha^{29} & \alpha^5 & \alpha^5 & \alpha^{20} & \alpha^{51} \\ \alpha^{36} & \alpha^{30} & \alpha^5 & \alpha^{13} & \alpha^{24} & \alpha^{56} \end{pmatrix} = 0$$

In the above-referenced Berlekamp text, a method of solving an equation such as Eq. 6 is given. Because the matrix of Eq. 6 includes a sub-matrix having a single 1 at each row, however, a simpler approach to a solution may be used. This simpler solution will now be described.

It may be observed that the solution lies in the null space of the column space of the matrix, thus implying that a permutation of the order of columns does not change the solution. Therefore, the above matrix equation (Eq. 6) is equivalent to the matrix equation:

$$[U \;\; L_0 \;\; L_1 \;\; L_2 \;\; L_3 \;\; L_4 \;\; L_5] \qquad \text{Eq. (7)}$$

$$\begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ \alpha^{49} & \alpha^{41} & \alpha^3 & \alpha^{23} & \alpha^{41} & \alpha^{42} \\ \alpha^{51} & \alpha^{20} & \alpha^5 & \alpha^3 & \alpha^5 & \alpha^{55} \\ \alpha^{56} & \alpha^{24} & \alpha^{13} & \alpha^{25} & \alpha^5 & \alpha^{36} \end{pmatrix} = 0$$

It may also be observed that the matrix of Eq. 7 has a 4×4 identity matrix as a sub-matrix. The null space of the column space is unchanged by performing column operations on the matrix. Thus, to enlarge the dimension of the identity sub-matrix to 5×5, every element in column 4 is multiplied by $\alpha^{41}$ and multiples of column 4 are added to every column of the matrix. The resulting matrix is of the form:

$$\begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ \alpha^{62} & \alpha^{28} & \alpha^{16} & \alpha^{8} & \alpha^{27} & \alpha^{44} \\ \alpha^{52} & \alpha^{61} & \alpha^{60} & \alpha^{26} & \alpha^{27} & \alpha^{52} \end{pmatrix} \quad \text{Matrix (1)}$$

Using the last column to eliminate the non-zero elements of row 5, the resulting matrix equation of Eq. (7) becomes:

$$[U\ L_0\ L_1\ L_2\ L_3\ L_4\ L_5] \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ \alpha^{16} & \alpha^{47} & \alpha^{15} & \alpha^{14} & \alpha^{12} & \alpha^{8} \end{pmatrix} = 0 \quad \text{Eq. (8)}$$

It can be shown that the null space of the column matrix of the form $$\begin{pmatrix} I_a \\ P \end{pmatrix}$$

is the row space of $[P\ I_b]$, where $I_a$ is an a × a identity matrix and $I_b$ is a b × b identity matrix, and P is any matrix of dimension b × a. In Eq. 8 above, a=6 and b=1. Therefore, the null space of Eq. 8 is $[\alpha^{16}\ \alpha^{47}\ \alpha^{15}\ \alpha^{14}\ \alpha^{12}\ \alpha^{8}\ 1]$. Consequently, $[U\ L_0\ L_1\ L_2\ L_3\ L_4\ L_5]$ is equal to $[\alpha^{16}\ \alpha^{47}\ \alpha^{15}\ \alpha^{14}\ \alpha^{12}\ \alpha^{8}\ 1]$, with U being equal to $\alpha^{16}$. Therefore, a least multiple of the error locator polynomial $\sigma(x)$ is $A(x)=L(x)+U$, where $U=\alpha^{16}$ and $L(x)=\alpha^{47}x+\alpha^{15}x^2+\alpha^{14}x^4+\alpha^{12}x^8+\alpha^{8}x^{16}+x^{32}$.

Figure 4:
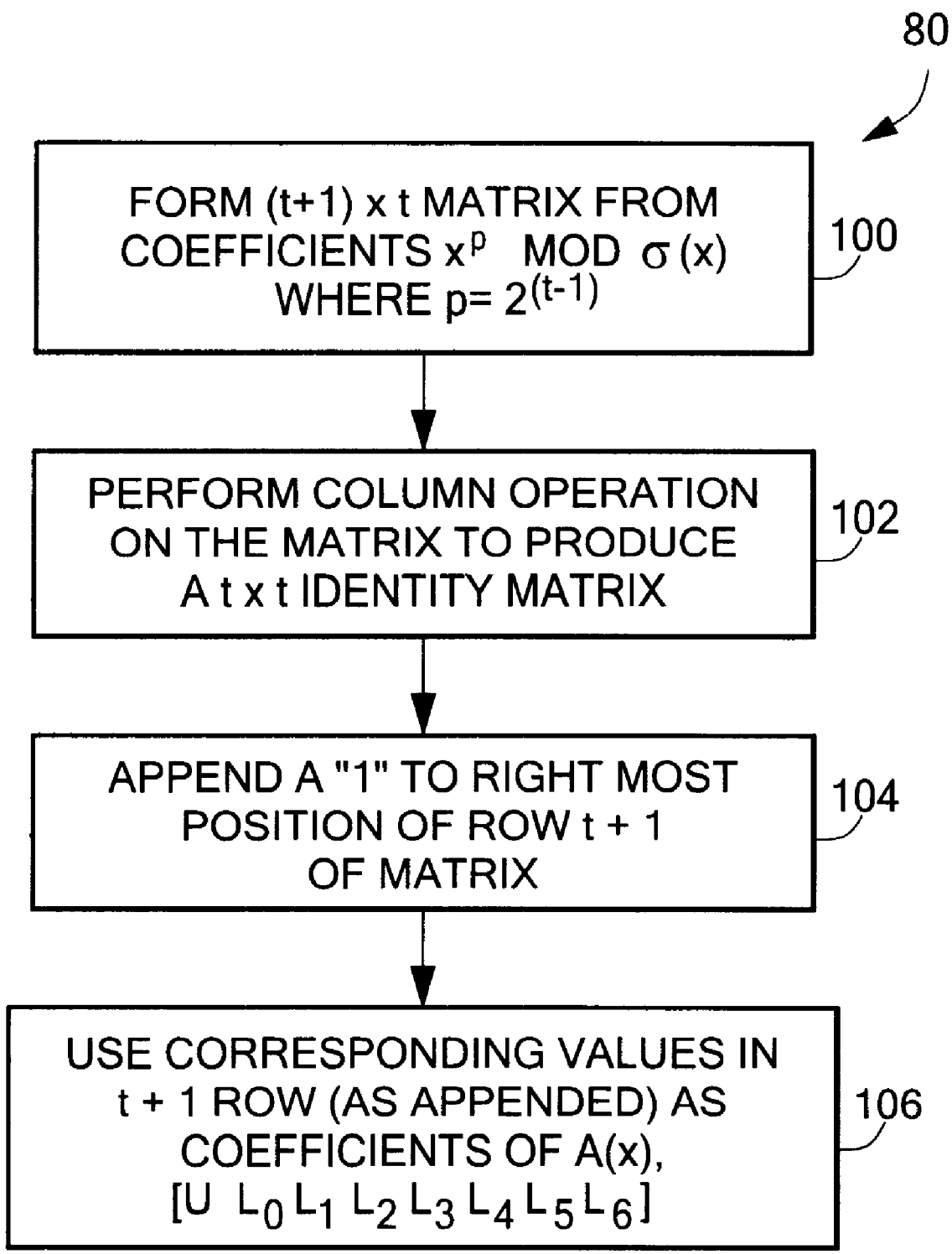
FIG. 4 is a flow diagram of a method of determining affine polynomials performed by the hybrid root determiner.

Referring to FIG. 4, a procedure for determining a least affine multiple A(x) of a given error locator polynomial σ(x) of degree t as performed by the affine polynomial generator 80 (FIG. 3) is as follows. A(t+1) by t matrix is formed from coefficients 1, x, $x^2$, $x^4$, . . . , $x^q$ mod σ(x) where $q=2^{(t-1)}$ (step 100). Column operations the matrix of Eq. (6) are performed to produce the matrix of Eq. (8) (step 102). The solution of the coefficients of the least multiple A(x) is obtained from the last row of the matrix by appending a single 1 at the right-most position (step 104).

When there are r columns in Eq. 1 or Eq. 2, or after any column operations are all zeroes, the r columns can be moved to the rightmost columns. Therefore, the (t+1) by t matrix in effect becomes a (t-r+1) by (t-r) matrix. In other words, the last r rows and the r rightmost columns of the matrix can be ignored. Consequently, the highest r coefficients of $L_j$ can be set to zero, thus reducing the number of roots of A(x). In fact, the number of roots becomes $2^{(t-r-1)}$ instead of $2^{(t-1)}$.

Once the affine polynomial A(x) is determined according to the procedure of FIG. 4, the affine polynomial root finding unit 82 (of FIG. 3) finds the roots of the affine polynomial A(x) by forming a binary matrix equation as shown in pp. 59–61 of the above-referenced Berlekamp text. Recalling that A(x)=L(x)+U and continuing with the same example as above, the values of U and $L(\alpha^0)$, $L(\alpha)$, $L(\alpha^2)$, $L(\alpha^3)$, $L(\alpha^4)$, and $L(\alpha^5)$ are computed as:

$L(\alpha^0)=[0\ 1\ 0\ 0\ 1\ 1]$ $L(\alpha)=[0\ 0\ 0\ 0\ 0\ 0]$ $L(\alpha^2)=[0\ 0\ 0\ 0\ 0\ 0]$ $L(\alpha^3)=[0\ 1\ 0\ 0\ 1\ 1]$ $L(\alpha^4)=[0\ 0\ 0\ 0\ 0\ 0]$ $L(\alpha^5)=[0\ 0\ 0\ 0\ 0\ 0]$ $U=[0\ 1\ 0\ 0\ 1\ 1]$ The solution for the equation A(x)=0 is obtained by finding all of the solutions of the binary matrix equation:

$$[z_5\ z_4\ z_3\ z_2\ z_1\ z_0] \begin{pmatrix} 0 & 0 & 0 & 0 & 0 & 0 \\ 0 & 0 & 0 & 0 & 0 & 0 \\ 0 & 1 & 0 & 0 & 1 & 1 \\ 0 & 0 & 0 & 0 & 0 & 0 \\ 0 & 0 & 0 & 0 & 0 & 0 \\ 0 & 1 & 0 & 0 & 1 & 1 \end{pmatrix} = \quad \text{Eq. (9)}$$

$$U = [0\ 1\ 0\ 0\ 1\ 1]$$

Or, using a short-hand notation:

$$Z \begin{pmatrix} L(\alpha^5) \\ L(\alpha^4) \\ L(\alpha^3) \\ L(\alpha^2) \\ L(\alpha^1) \\ L(\alpha^0) \end{pmatrix} = U \quad \text{Eq. (10)}$$

where each element is a field element represented in binary form. The solution of the above equation can be found by solving $$Z \begin{pmatrix} L(\alpha^5) \\ L(\alpha^4) \\ L(\alpha^3) \\ L(\alpha^2) \\ L(\alpha^1) \\ L(\alpha^0) \\ U \end{pmatrix} = 0 \quad \text{Eq. (11)}$$

where $Z'=[z_5\ z_4\ z_3\ z_2\ z_1\ z_0\ 1]$. Therefore, Eq. (9) may be expressed in the form of $$[z_5\ z_4\ z_3\ z_2\ z_1\ z_0\ 1]\begin{pmatrix}0&0&0&0&0&0\\0&0&0&0&0&0\\0&1&0&0&1&1\\0&0&0&0&0&0\\0&0&0&0&0&0\\0&1&0&0&1&1\\0&1&0&0&1&1\end{pmatrix}=0 \quad \text{Eq. (12)}$$

Consequently, $[z_5\ z_4\ z_3\ z_2\ z_1\ z_0\ 1]$ belongs to the null space of the column space of the matrix of Eq. 12. Performing column operations on the matrix yields:

```
0 0 0 0 0 0
0 0 0 0 0 0
1 0 0 0 0 0
0 0 0 0 0 0
0 0 0 0 0 0
1 0 0 0 0 0
1 0 0 0 0 0
```
Matrix (2)

Since the last five columns are all zeroes, they can be ignored. The null space is the row space of the following rows (in this case, the property $[P, I]^T$ is orthogonal to $[I, P]$ is used, where T denotes matrix transpose):

```
1 0 0 0 0 0 0
0 1 0 0 0 0 0
0 0 1 0 0 0 1
0 0 0 1 0 0 0
0 0 0 0 1 0 0
0 0 0 0 0 1 1
```
Matrix (3)

The row space should be made such that the last column contains a single 1 at the last row:

```
          |
1 0 0 0 0 0 | 0
0 1 0 0 0 0 | 0
0 0 1 0 0 0 | 0
0 0 0 1 0 0 | 0
0 0 0 0 1 0 | 0
0 0 0 0 0 1 | 1
          |
```
Matrix (4)

Note that the last column must contain one and only one element "1" at the last row. The sum of any linear combination of the first five rows and the last row to the left of the vertical bar are the 32 solutions to $A(x)=0$. In other words, the solution of $A(x)$ is given by:

$$\begin{aligned}[z_5\ z_4\ z_3\ z_2\ z_1\ z_0]=&[0\ 0\ 0\ 0\ 0\ 1]+\\&c_0^*[0\ 0\ 0\ 0\ 1\ 0]+\\&c_1^*[0\ 0\ 0\ 1\ 0\ 0]+\\&c_2^*[0\ 0\ 1\ 0\ 0\ 1]+\\&c_3^*[0\ 1\ 0\ 0\ 0\ 0]+\end{aligned} \quad \text{Eq. (13)}$$

-continued $$c_4^*[1\ 0\ 0\ 0\ 0\ 0]$$

where [000001], [000010], [000100], [001001], [010000] and [10000] are field elements or values for generating roots of $A(x)$. Each root of $A(x)$ therefore corresponds to a different XOR sum of 000001 and any zero or more of the other five field elements. These different linear combinations of field values are produced by varying values of a five-bit binary word "selector", indicated as $[c_o, \ldots, C_4]$ in Eq. 13.

In the event that U is placed in the first row instead of the last row, Eq. 12 becomes $$Z''\begin{pmatrix}U\\L(\alpha^5)\\L(\alpha^4)\\L(\alpha^3)\\L(\alpha^2)\\L(\alpha^1)\\L(\alpha^0)\end{pmatrix}=0 \quad \text{Eq. 12'}$$

with $Z''=[1\ z_5\ z_4\ z_3\ z_2\ z_1\ z_0]$ or, $$[1\ z_5\ z_4\ z_3\ z_2\ z_1\ z_0]\begin{pmatrix}0&1&0&0&1&1\\0&0&0&0&0&0\\0&0&0&0&0&0\\0&1&0&0&1&1\\0&0&0&0&0&0\\0&0&0&0&0&0\\0&1&0&0&1&1\end{pmatrix}=0 \quad \text{Eq. (14)}$$

The null space of the column space of the above matrix is the row space of

```
  |
0 | 1 0 0 0 0 0
0 | 0 1 0 0 0 0
1 | 0 0 1 0 0 0
0 | 0 0 0 1 0 0
0 | 0 0 0 0 1 0
1 | 0 0 0 0 0 1
  |
```

Using row operations to ensure that there is a single "1" in the first column yields:

```
  |
0 | 1 0 0 0 0 0
0 | 0 1 0 0 0 0
0 | 0 0 1 0 0 0
0 | 0 0 0 1 0 0
0 | 0 0 0 0 1 0
1 | 0 0 0 0 0 1
  |
```

Again, the solution of the A(x) is of the form $$[z_5 \ z_4 \ z_3 \ z_2 \ z_1 \ z_0] = [0 \ 0 \ 0 \ 0 \ 0 \ 1] +$$
$$c_0^*[0 \ 0 \ 0 \ 0 \ 1 \ 0] +$$
$$c_1^*[0 \ 0 \ 0 \ 1 \ 0 \ 0] +$$
$$c_2^*[0 \ 0 \ 1 \ 0 \ 0 \ 1] +$$
$$c_3^*[0 \ 1 \ 0 \ 0 \ 0 \ 0] +$$
$$c_4^*[1 \ 0 \ 0 \ 0 \ 0 \ 0].$$

There are other ways to find the solution of A(x). For example, a slightly different approach is set forth in the Berlekamp text mentioned above.

Once the solution associated with the set of roots of A(x) has been determined and the individual roots themselves are generated, it is necessary to determine which of the 32 roots are the true roots of the error locator polynomial and thus satisfy the original equation σ(x)=0. Like the root finding operation for the affine polynomial as described above, the root finding operation for the error locator polynomial can also be made more efficient through the use of linearized polynomial properties.

Returning to the example $\sigma(x)=x^6+\alpha^{59}x^5+\alpha^2x^4+\alpha^{24}x^3+\alpha^{21}x^2+\alpha^{40}x+\alpha^{59}$, the terms of σ(x) are grouped into sum of products $x^j$ with linearized polynomials $\sigma(X)=[x^2+\alpha^{59}x]x^4+\alpha^{24}x^3+[\alpha^2x^4+\alpha^{21}x^2+\alpha^{40}x]+\alpha^{59}$, with each pair of brackets containing a linearized polynomial. The values of the linearized polynomials for six field elements, [0 0 0 0 0 1], [0 0 0 0 1 0], [0 0 0 1 0 0], [0 0 1 0 0 1], [0 1 0 0 0 0] and [1 0 0 0 0 0] are determined to be:

| Field element x | Value of coef(4) = $[\alpha^0x^2 + \alpha^{59}x]$ | Value for coef(0) = $[\alpha^2x^4 + \alpha^{21}x^2 + \alpha^{40}x]$ |
|---|---|---|
| [0 0 0 0 0 1] = $r_c$ | [1 1 1 1 0 0] = $w_c$ | [0 1 0 0 0 0] = $s_c$ |
| [0 0 0 0 1 0] = r(0) | [1 1 1 1 0 1] = w(0) | [1 1 0 1 1 1] = s(0) |
| [0 0 0 1 0 0] = r(1) | [1 0 0 0 0 1] = w(1) | [0 0 1 0 0 0] = s(1) |
| [0 0 1 0 0 1] = r(2) | [0 0 1 1 0 1] = w(2) | [1 1 1 1 0 1] = s(2) |
| [0 1 0 0 0 0] = r(3) | [0 0 1 1 0 1] = w(3) | [0 1 1 0 1 0] = s(3) |
| [1 0 0 0 0 0] = r(4) | [1 1 0 0 1 0] = w(4) | [0 0 1 0 0 1] = s(4) |

In accordance with the linearized property of the linearized polynomial, a selection of a field element of r(j) dictates the selection of a corresponding field element of w(j) and s(j). For example, if the value of x is set to be $r_c$+r(1)+r(4), then the coef(4) is set to $w_c$+w(1)+w(4) and coef(0) is $s_c$+s(1)+s(4). Note that $r_c$ is always selected.

Coding techniques may be utilized to reduce the number of XORs to be performed in computing x, coef(4) and coef(0). Preferably, the coding technique uses Gray code, which has the property that adjacent code words differ by one and only one bit. This property can be used to systematically generate all of the 5-bit Gray code words [$c_0 \ c_1 \ c_2 \ c_3 \ c_4$] to construct the 32 solutions for each of x, coef(4) and coef(0) with fewer XORing operations. One possible algorithm used by the Gray code sequence generator 86 (FIG. 3) for generating a Gray code sequence toggles the lowest ordered bit that results in a new code. Accordingly, each of the 32-roots of A(x) can be generated by XORing $r_c$ (as well as $s_c$ and $w_c$) with one and only one r(j) (and s(j) and w(j), for $s_c$ and $w_c$, respectively) by employing the 5-bit Gray code sequence generated in this manner as shown below:

| Natural 5-bit sequence b code | Gray code word b + (right_shift of b) | Difference with previous Gray word |
|---|---|---|
| [00000] | [00000] | — |
| [00001] | [00001] | [00001] |
| [00010] | [00011] | [00010] |
| [00011] | [00010] | [00001] |
| [00100] | [00110] | [00100] |
| [00101] | [00111] | [00001] |
| [00110] | [00101] | [00010] |
| [00111] | [00100] | [00001] |
| [01000] | [01100] | [01000] |
| [01001] | [01101] | [00001] |
| [01010] | [01111] | [00010] |
| [01011] | [01110] | [00001] |
| [01100] | [01010] | [00100] |
| [01101] | [01011] | [00001] |
| [01110] | [01001] | [00010] |
| [01111] | [01000] | [00001] |
| [10000] | [11000] | [10000] |
| [10001] | [11001] | [00001] |
| [10010] | [11011] | [00010] |
| [10011] | [11010] | [00001] |
| [10100] | [11110] | [00100] |
| [10101] | [11111] | [00001] |
| [10110] | [11101] | [00010] |
| [10111] | [11100] | [00001] |
| [11000] | [10100] | [01000] |
| [11001] | [10101] | [00001] |
| [11010] | [10111] | [00010] |
| [11011] | [10110] | [00001] |
| [11100] | [10010] | [00100] |
| [11101] | [10011] | [00001] |
| [11110] | [10001] | [00010] |
| [11111] | [10000] | [00001] |

It can be seen from the last column's numbers, which correspond to the least significant "1" values of the numbers in the first column, that the successive Gray code words are obtained by toggling the Gray code bits in the order 0, 1, 0, 2, 0, 1, 0, 3, 0, 1, 0, 2, 0, 1, 0, 4, 0, 1, 0, 2, 0, 1, 0, 3, 0, 1, 0, 2, 0, 1, 0. The toggled bit is used as a select j to select an element of r(j), s(j) and w(j). For example, a toggle bit $c_j$, where j=0, selects r(0), s(0) and w(0).

The generation of four root values for each of x, coef(4) and coef(0) from an initial starting value for Gray code driven values of j is illustrated below.

| Gray code ($C_4$—$C_0$) | j | r (j) | w (j) | s (j) | Step |
|---|---|---|---|---|---|
| 00000 | | 000001 | 111100 | 010000 | "0" |
| 00001 | 0 | 000010 | 111101 | 110111 | |
| | | 000011 | 000001 | 100111 | "1" |
| 00011 | 1 | 000100 | 100001 | 001000 | |
| | | 000111 | 100000 | 101111 | "2" |
| 00010 | 0 | 000010 | 111101 | 110111 | |
| | | 000101 | 011101 | 011000 | "3" |
| 00110 | 2 | 001001 | 001101 | 111101 | |
| | | 001100 | 010000 | 100101 | "4" |

Figure 5:
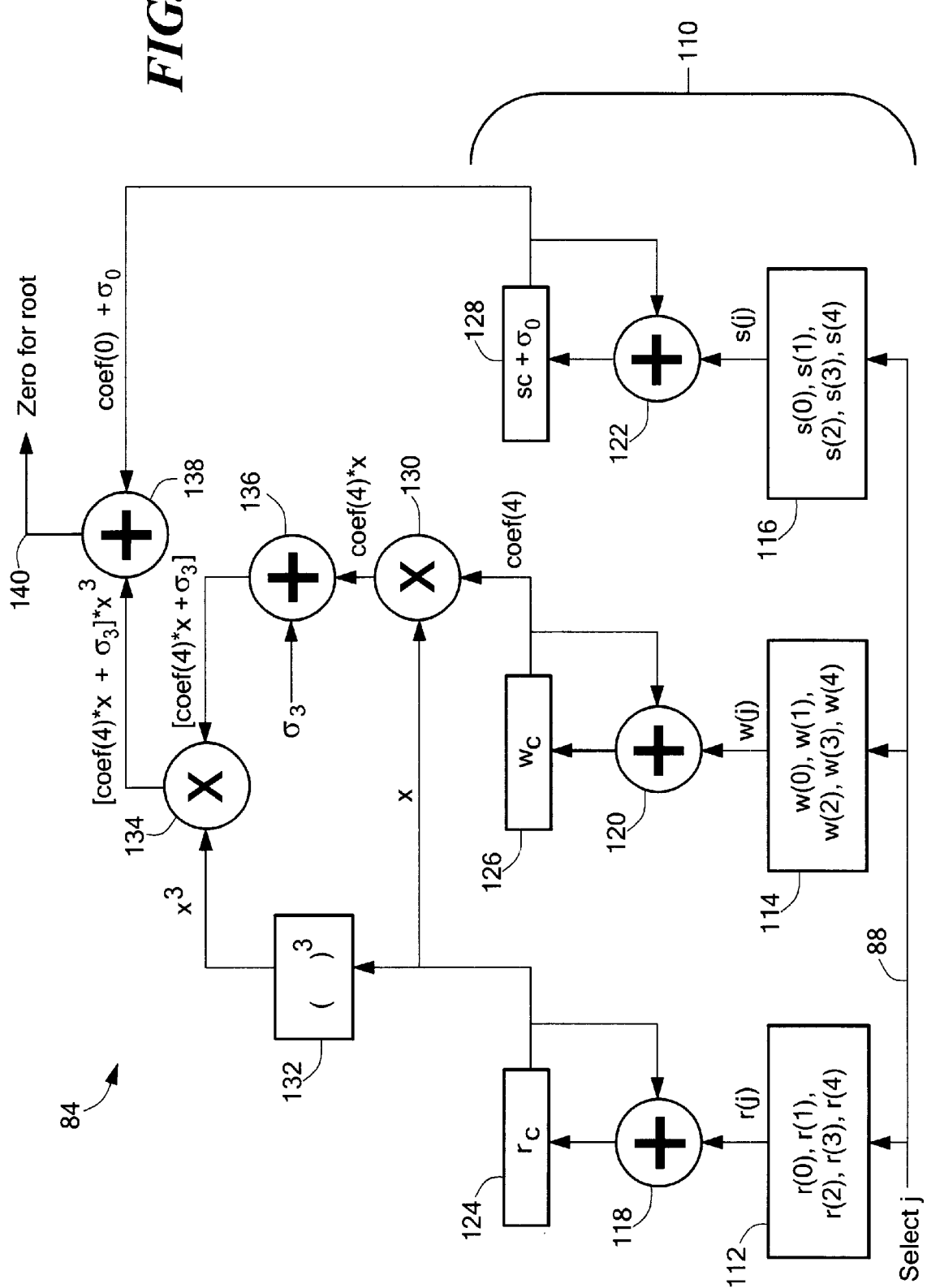
FIG. 5 is a circuit diagram of an error location polynomial root finding unit of the hybrid root determiner.

Referring to FIG. 5, the σ(x) root determination unit 84 is shown in detail. The circuit includes an A(x) root generation portion 110 for computing x, coef(4) and coef(0). The select j 88 (received from the Gray code sequence generator 86 of FIG. 3) is coupled to unit 112 for storing values for r(j), and units 114 and 116 for computing and storing values for w(j) and s(j), respectively, based on field values received from the affine polynomial solution finding unit 82 of FIG. 3. The σa(x) root determination unit 84 further includes first, second and third XOR gates 118, 120 and 122, for XORing the selected ones of the stored values of r(j), w(j) and s(j), respectively, as selected by j 88, to an output of registers 124, 126 and 128, which are initialized to $r_c$, $w_c$ and $s_c+\sigma_0$, respectively. It can be seen that register 128 sums the coefficient $\sigma_0$ (received from unit 42 (FIG. 2) with the computation of coef(0) by setting the initial condition of the register 128 to $s_c+\sigma_0$. The output of register 124 is provided to the XOR gate 118 and is provided to a multiplier 130 and a unit 132. The output of register 126 is provided to the XOR gate 120 and the multiplier 130, which generates the product $w_c*x$. The unit 132 raises the value x received from register 124 to a third power and provides this result, $x^3$, to a second multiplier 134. The output of the multiplier 130 and the coefficient C3 are XORed by a fourth XOR gate 136, which produces the sum $w_c*x+\sigma_3$ and provides that sum to the second multiplier 134, which produces $(w_c*x+\sigma_3)*x^3$. The output of the register 128 is returned to the XOR gate 122 and is also provided to the fifth XOR gate 138, which XORs the contents of the register 128 with the output of the second multiplier. 134, that is, $(w_c*x+\sigma_3)*x^3$. The output of the fifth XOR gate 138 provides an indication 140 as to whether or not tested roots are true roots of $\sigma(x)$. If the output is a zero, the tested root is a root of $\sigma(x)$ and corresponds to an error. Thus, with the modification of the A(x) root generation 110 to include $\sigma_0$ and appropriate exponentiation of x, the entire root determination is made for $\sigma(x)$.

With reference to the root determination unit 84 of FIG. 5, only two multipliers and a circuit for raising a field element to its third power are needed to evaluate the A(x) roots as true roots of $\sigma(x)$. In comparison, a conventional circuit for testing a degree 6 error locator polynomial (i.e., a Chien search circuit, as described earlier) requires six multipliers. While only 32 roots are examined for the example discussed above, the Chien search would require the examination of all 63 elements of $GF(2^6)$. For small fields, the savings in computation time may not be significant. However, the savings becomes increasingly more significant with increasing field size since the number of field elements increases exponentially (as the field becomes larger) while the number of roots of A(x) remains the same. For example, for a Galois Field $GF(2^{16})$, the total number of possible roots is 65535.

Figure 6:
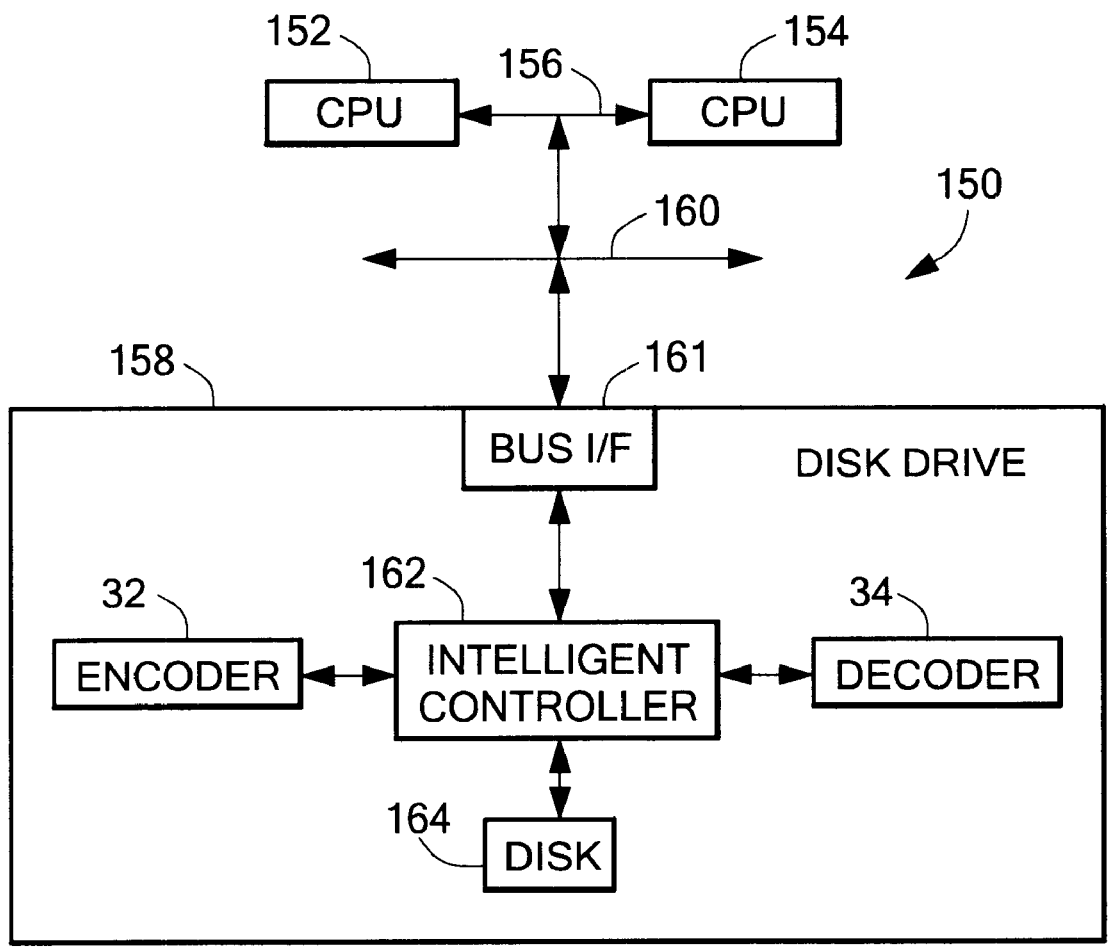
FIG. 6 is a block diagram of an exemplary computer system within which the decoder having the hybrid root determiner may be utilized.

Although the hybrid root finding mechanism has been described within the context of the data storage system 10 as shown in FIG. 1, other system implementations and operations are contemplated. For example, and with reference to FIG. 6, a computer system 150 (e.g., a PC) includes a CPU 152 coupled to a memory 154 by a memory bus 156 and connected to peripheral device such as a drive unit (e.g., a disk drive unit as shown) 158 via a local bus 160 and perhaps additional bus-to-bus bridge logic (not shown). The local bus 160 may conform to standard local bus protocols, e.g., SCSI, PCI or AT Attachment (ATA). The drive unit 158 includes a bus interface 161 for receiving data from and transferring data to the CPU 152 or memory 154. The bus interface 161 is compliant with the protocols of the local bus 160. For example, the bus interface may be an ATA bus interface, and the drive unit therefore an ATA-compliant device. The drive unit 158 further includes an intelligent controller 162 for reading data from and writing data to a disk 164, as well as the encoder 32 (FIG. 1) for encoding data to be stored on the disk and the decoder 34 (FIG. 1) employing the hybrid root-finding mechanism described above to decode encoded data read from the disk.

Further embodiments are contemplated. The Gray code could be used to generate field values to be evaluated by a conventional Chien search circuit, thus reducing the number of multipliers needed in the Chien search circuit. Also, the error locator polynomial need not be solved in the form of linearized polynomials (as described above).

Additionally, other coding approaches for linear combination of field elements may be used. The purpose of such coding is to reduce the number of XOR operations used to form all possible combinations of $[z_5, z_4, z_3, z_2, z_1, z_0]$=[0 0 0 0 0 1]+$c_0$[0 0 0 0 1 0]+$c_1$[0 0 0 1 0 0]+$c_2$[0 0 1 0 0 1]+$c_3$[0 1 0 0 0 0]+$c_4$[1 0 0 0 0 0]. For a given selection of the coefficients $c_0, \ldots, C_4$, a certain number of XOR operations must be performed. In one alternative coding approach, any element constructed for a given [1 $c_3$ $c_2$ $c_1$ $c_0$] can be constructed from [0 $c_3$ $c_2$ $c_1$ $c_0$] with one XOR operation. For example, if $c_4$=0, $c_3$=1, $c_2$=0, $c_1$=1, $_0$=1, then [$z_5, z_4, z_3, z_2, z_1, z_0$]=[0 1 0 1 1 1]. For $c_4$=1, $c_3$=1, $c_2$=0, $c_1$=1, $c_0$=1, then a new [$z_5, z_4, z_3, z_2, z_1, z_0$] is equal to [0 1 0 1 1 1]+[1 0 0 0 0 0]=[1 1 0 1 1 1] with only one XOR operation.

It can be observed from the above discussion that the coding mechanism performs the XORs in a conventional manner according to [$c_4$ $c_3$ $c_2$ $c_1$ $c_0$] when $c_4$ is zero. Consequently, there are no savings in the number of XOR operations to be performed during the first half of the coding. When $c_4$ is 1, however, the combination is obtained from the combination for $c_4$=0 with one XOR operation.

The entire coding for the 5-bit combinations according to this alternative coding approach are shown below:

| Natural 5-bit Sequence b Code | Coding Method | Number of XORs | |
|---|---|---|---|
| [00000] | [00000] | 0 | |
| [00001] | [00001] | 1 | |
| [00010] | [00010] | 1 | |
| [00011] | [00011] | 2 | |
| [00100] | [00100] | 1 | |
| [00101] | [00101] | 2 | |
| [00110] | [00110] | 2 | |
| [00111] | [00111] | 3 | |
| [01000] | [01000] | 1 | |
| [01001] | [01001] | 2 | |
| [01010] | [01010] | 2 | |
| [01011] | [01011] | 3 | |
| [01100] | [01100] | 2 | |
| [01101] | [01101] | 3 | |
| [01110] | [01110] | 3 | |
| [01111] | [01111] | 4 | |
| [10000] | [10000] + [00000] | 1 | {1} |
| [10001] | [10000] + [00001] | 1 | {2} |
| [10010] | [10000] + [00010] | 1 | {2} |
| [10011] | [10000] + [00011] | 1 | {3} |
| [10100] | [10000] + [00100] | 1 | {2} |
| [10101] | [10000] + [10101] | 1 | {3} |
| [10110] | [10000] + [00110] | 1 | {3} |
| [10111] | [10000] + [00111] | 1 | {4} |
| [11000] | [10000] + [01000] | 1 | {2} |
| [11001] | [10000] + [01001] | 1 | {3} |
| [11010] | [10000] + [01010] | 1 | {3} |
| [11011] | [10000] + [01011] | 1 | {4} |
| [11100] | [10000] + [01100] | 1 | {3} |
| [11101] | [10000] + [01101] | 1 | {4} |
| [11110] | [10000] + [01110] | 1 | {4} |
| [11111] | [10000] + [01111] | 1 | {5} |

The number of XOR operations that are eliminated by this approach can be obtained by comparing the number 1 with the number of XOR operations required without coding (indicated above in { }).

It is to be understood that while the invention has been described in conjunction with the detailed description thereof, the foregoing description is intended to illustrate and not limit the scope of the invention, which is defined by the scope of the appended claims. Other embodiments are within the scope of the following claims.

What is claimed is:

1. An apparatus for processing an erroneous code word comprising:

an error locator polynomial generator to determine an error locator polynomial associated with the erroneous code word;

circuitry to find field elements for generating roots of a least affine multiple of the error locator polynomial;

an error locator polynomial root determination unit to use a Gray code sequence to select linear combinations of one or more of the field elements to generate the roots of the least affine multiple and evaluate such roots as true roots of the error locator polynomial;

wherein the error locator polynomial root determination unit operates on the error locator polynomial in a form that includes coefficients which comprise linearized polynomials, the error locator polynomial root determination unit providing values of the linearized polynomials for each of the field elements; and wherein, during each root generation, the error locator polynomial root determination unit uses the Gray code sequence to select a linear combination of one or more of the values for each of the linearized polynomials so that such values are selected when the field elements for which such values are provided are selected.

2. The apparatus of claim 1, wherein the error locator polynomial root determination unit generates each of the roots by performing one Exclusive-OR operation for each selected linear combination of field elements.

3. The apparatus of claim 2, wherein the use of the Gray code causes only one of the field elements to be Exclusive-ORed with a previously generated root for each root generation.

4. The apparatus of claim 1, wherein the error locator polynomial root determination unit generates a result for each linearized polynomial for each root generation by performing an Exclusive-OR operation for each selected linear combination of one or more of the values.

5. The apparatus of claim 4, wherein, for each linearized polynomial, the use of the Gray code causes only one of the values to be Exclusive-ORed with a previously generated result for each root generation.

6. A method for processing an erroneous code word comprising:

determining an error locator polynomial associated with the erroneous code word;

finding field elements for generating roots of a least affine multiple of the error locator polynomial;

using a Gray code sequence to select linear combinations of one or more of the field elements to generate the roots of the least affine multiple;

providing the error locator polynomial in a form that includes coefficients which comprise linearized polynomials;

providing values of the linearized polynomials for each of the field elements; and during each root generation, using the Gray code sequence to select a linear combination of one or more of the values for each of the linearized polynomials so that such values are selected when the field elements for which such values are provided are selected; and evaluating the roots as the true roots of the error locator polynomial.

7. The method of claim 6, wherein each of the roots is generated by performing one Exclusive-OR operation for each selected linear combination of field elements.

8. The method of claim 7, wherein the use of the Gray code causes only one of the field elements to be Exclusive-ORed with a previously generated root for each root generation.

9. The method of claim 6, wherein a result for each linearized polynomial for each root generation is generated by performing an Exclusive-OR operation for each selected linear combination of one or more of the values.

10. The method of claim 9, wherein, for each linearized polynomial, the use of the Gray code causes only one of the values to be Exclusive-ORed with a previously generated result for each root generation.

11. An apparatus for processing an erroneous code word comprising:

an error locator polynomial generator to determine an error locator polynomial associated with the erroneous code word;

circuitry to find field elements for generating roots of a least affine multiple of the error locator polynomial;

an error locator polynomial root determination unit to use a binary code sequence to select linear combinations of one or more of the field elements to generate the roots of the least affine multiple and evaluate such roots as true roots of the error locator polynomial;

wherein the error locator polynomial root determination unit operates on the error locator polynomial in a form that includes coefficients which comprise linearized polynomials, the error locator polynomial root determination unit providing values of the linearized polynomials for each of the field elements; and wherein, during each root generation, the error locator polynomial root determination unit uses the binary code sequence to select a linear combination of one or more of the values for each of the linearized polynomials so that such values are selected when the field elements for which such values are provided are selected.

12. The apparatus of claim 11, wherein the binary code sequence comprises a Gray code sequence.

13. A method for processing an erroneous code word comprising:

determining an error locator polynomial associated with the erroneous code word;

finding field elements for generating roots of a least affine multiple of the error locator polynomial;

using a binary code sequence to select linear combinations of one or more of the field elements to generate the roots of the least affine multiple;

providing the error locator polynomial in a form that includes coefficients which comprise linearized polynomials;

providing values of the linearized polynomials for each of the field elements; and during each root generation, using the binary code sequence to select a linear combination of one or more of the values for each of the linearized polynomials so that such values are selected when the field elements for which such values are provided are selected; and evaluating the roots as the true roots of the error locator polynomial.

14. The apparatus of claim 13, wherein the binary code sequence comprises a Gray code sequence.

15. A disk drive unit comprising:

a disk;

a decoder; and a read/write controller connected to the disk and the decoder, the read/write controller reading an erroneous code word from the disk and providing the erroneous code word to the decoder;

wherein the decoder comprises:

an error locator polynomial generator to determine an error locator polynomial associated with the erroneous code word;

circuitry to find field elements for generating roots of a least affine multiple of the error locator polynomial;

an error locator polynomial root determination unit to use a binary code sequence to select linear combinations of one or more of the field elements to generate the roots of the least affine multiple and evaluate such roots as true roots of the error locator polynomial;

wherein the error locator polynomial root determination unit operates on the error locator polynomial in a form that includes coefficients which comprise linearized polynomials, the error locator polynomial root determination unit providing values of the linearized polynomials for each of the field elements; and wherein, during each root generation, the error locator polynomial root determination unit uses the binary code sequence to select a linear combination of one or more of the values for each of the linearized polynomials so that such values are selected when the field elements for which such values are provided are selected.

16. The disk drive unit of claim 15, wherein the binary code sequence comprises a Gray code sequence.

* * * * *